United States Patent [19]
Lewyn et al.

[11] Patent Number: 4,467,227
[45] Date of Patent: Aug. 21, 1984

[54] CHANNEL CHARGE COMPENSATION SWITCH WITH FIRST ORDER PROCESS INDEPENDENCE

[75] Inventors: Lanny L. Lewyn, Palo Alto; Charles H. Lucas, Newport Beach, both of Calif.

[73] Assignee: Hughes Aircraft Company, El Segundo, Calif.

[21] Appl. No.: 316,175

[22] Filed: Oct. 29, 1981

[51] Int. Cl.³ .................... H03K 17/687; H03K 17/16
[52] U.S. Cl. .................................... 307/577; 307/353; 307/579
[58] Field of Search .............. 307/491, 246, 571, 572, 307/577, 579, 582, 583, 584, 585, 352, 353; 368/155, 156, 159

[56] References Cited

U.S. PATENT DOCUMENTS 4,308,468  12/1981  Olson ................... 307/353
4,323,798   4/1982  Watkins ................ 307/491
4,393,318   7/1983  Takahashi et al. ...... 307/353

FOREIGN PATENT DOCUMENTS 919087  4/1982  U.S.S.R. ............... 307/571

OTHER PUBLICATIONS

Marshall, Jr., "Reduce Sampling Errors by Adding an RC Network to Your Sample-and-Hold", Electronic Design 5, pp. 68 and 70, 3/1/78.

Primary Examiner—Larry N. Anagnos
Assistant Examiner—David R. Bertelson
Attorney, Agent, or Firm—John Holtrichter, Jr.; A. W. Karambelas

[57] ABSTRACT

In the present invention, channel charge compensation is achieved in a MOS switch comprising two MOSFETs connected in parallel and a compensating MOSFET placed on the semiconductive substrate in precise symmetry with the two switching FETs, each of the FETs being designed to have the same channel charge storing capacity. Accordingly, first order variations in oxide thickness or in gate width across the surface of the semiconductive substrate do not affect the accuracy with which channel charge is compensated in the invention. The compensating FET is switched in complementary fashion with the two switching FETs so that it absorbs one-half of the channel charge expelled from the switching FETs when they are turned off, thus preventing this charge from upsetting other components in the circuit such as precision storage capacitors connected to the switch.

12 Claims, 10 Drawing Figures

CHANNEL CHARGE COMPENSATION SWITCH WITH FIRST ORDER PROCESS INDEPENDENCE

TECHNICAL FIELD

This invention is a metal oxide semiconductor (MOS) switch in which compensation is made for charge expelled from the source-to-drain channel of the switch when the switch is turned off. The invention is useful for switching capacitances in precision devices such as sample-and-hold circuits in digital-to-analog converters and in tuning sections of watch circuits.

BACKGROUND ART

Precision circuits implemented in metal oxide semiconductor (MOS) integrated circuits include digital-to-analog converters, sample-and-hold circuits and watch circuits having a capacitive tuning section. In each of these circuits, precision capacitors must be switched in and out of the circuit to accurately control voltage levels. The accuracy of such a circuit is impaired if the switching operation changes the amount of charge stored on any of the capacitors which are switched in and out of the circuit. A well-known problem exists whenever an MOS field effect transistor (FET) is used as a switch controlling a precision capacitor, this problem being that the source-to-drain channel of the FET stores charge whenever the FET is turned on. This channel charge is expelled from the channel whenever the FET is turned off. Approximately half of the charge is expelled through the drain, the remainder being expelled through the source so that the amount of charge stored on a capacitor connected to either the source or the drain is increased by one-half of the channel charge stored in the FET whenever the FET is turned off. Accordingly, the voltage across the capacitor varies as the FET is switched on and off in an amount proportional to the capacitance of the capacitor divided by approximately one-half the channel charge stored in the FET.

One prior art solution to this problem is to connect a compensating FET to the node between the capacitor and the switching FET, the compensating FET storing charge in its source-to-drain channel in an amount equal to about one-half the charge stored by the switching FET in its source-to-drain channel. The compensating FET and the switching FET are controlled in complementary fashion so that when the switching FET is turned off, the compensating FET is turned on and absorbs one-half of the channel charge from the switching FET which would otherwise have been stored on the capacitor. Accordingly, the capacitor voltage does not change as much when the switching FET is turned on and off.

This prior art solution suffers from two problems. First, spatial nonuniformities in oxide thickness and gate width across the surface of the integrated circuit chip are usually unavoidable due to imperfections in the process by which MOS circuits are fabricated. Such nonuniformities in oxide thickness and gate width give rise to uncertainty or inaccuracy in the channel charge storing capacity of the compensating transistor. Accordingly, the compensating transistor does not store exactly one-half of the channel charge expelled from the switching FET. Thus, if the channel charge capacity of the compensating FET is greater than one-half the channel charge capacity of the switching FET, the compensating FET may subtract charge from the storage capacitor when it is turned on. On the other hand, if the channel charge capacity of the compensating FET is too small, some of the charge expelled from the switching FET will be added to the storing capacitor. In both cases, the compensation is not exact and therefore the voltage stored across the storing capacitor will vary as the two FETs are turned on and off respectively, a significant disadvantage. The other problem is that the compensating FET only absorbs that charge which is expelled from the one side of the switching FET which is connected to the storage capacitor. The remaining half of the channel charge expelled from the opposite side of the switching FET is not compensated and may enter into other parts of the circuit.

SUMMARY OF THE INVENTION

In the present invention, channel charge compensation is achieved in a MOS switch comprising two MOSFETs connected in parallel and a compensating MOSFET symmetrically placed on the semiconductive substrate precisely half-way between the two switching FETs, each of the FETs being designed to have the same channel charge storing capacity. Because of the symetrical arrangement, linear variations in oxide thickness or in gate width across the surface of the semiconductive substrate do not affect the accuracy with which channel charge is compensated in the invention. The compensating FET is switched in complementary fashion with the two switching FETs so that it absorbs one-half of the channel charge expelled from the switching FETs when they are turned off, thus preventing this charge from upsetting other components in the circuit such as precision storage capacitors connected to the switch.

While the compensating FET absorbs one-half of the channel charge expelled from each of the switching FETs, compensation for the remaining half of the channel charge expelled is made in this invention by connecting a fourth FET to the opposite side of the switching FETs. In this latter arrangement, all of the four FETs are located side by side, the two switching FETs located in the middle and the two compensating FETs located on either end, one of the compensating FETs being connected across the drains of the two switching FETs, the other compensating FET being connected across the sources of the two switching FETs.

In the preferred embodiment of the invention, each compensating and switching FET is replaced by a complementary n-channel and p-channel FET pair.

The invention is used, for example, in the tuning section of an electronic watch circuit wherein the circuit is tuned with a crystal in a precise manner by switching selected ones of a plurality of precision capacitors into the circuit, each capacitor being switched by one channel charge compensated switch of the present invention.

DESCRIPTION OF THE DRAWINGS

The invention is best understood by reference to the accompanying drawings, of which:

FIG. 1b is a simplified plan view of the switching and compensating FETs of the switch of FIG. 1a;

FIG. 2b is a simplified plan view of a three transistor embodiment of the channel charge compensated switch of FIG. 2a;

FIG. 2c is a diagram corresponding to FIG. 2b and illustrating an exemplary variation in oxide thickness as a function of position on the semiconductive substrate of the circuit of FIG. 2a;

FIG. 2d is a simplified plan view of a four transistor embodiment of the channel charge compensated switch of FIG. 2a;

FIG. 3 is a simplified schematic diagram of a complementary metal oxide semiconductor (CMOS) version of the three transistor embodiment of the circuit of FIG. 2a;

FIG. 4a is a simplified schematic diagram of a CMOS version of the four transistor embodiment of the circuit of FIG. 2a;

FIG. 4b is a simplified plan view of the circuit of FIG. 4a; and

DETAILED DESCRIPTION OF THE INVENTION

Figure 1A:
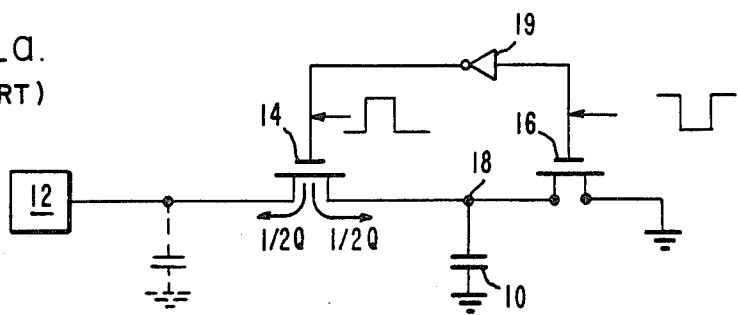
FIG. 1a is a simplified schematic diagram of a prior art channel charge compensated switch.

Referring to FIG. 1a, a precision device such as a sample-and-hold capacitor 10 is connected to a circuit 12 through a switching MOSFET 14. The switching FET stores a charge Q in its source-to-drain channel as long as it is turned on. However, when the switching FET is turned off, the charge Q stored in the channel is expelled therefrom, part of the charge, approximately $(\frac{1}{2})Q$, being expelled toward the circuit 12 and the remainder of the charge, approximately $(\frac{1}{2})Q$, being expelled to the capacitor 10, thus inducing an error in the voltage stored by the capacitor 10 proportional to $(\frac{1}{2})(Q/C)$, where C is the capacitance of the capacitor 10.

Figure 1B:
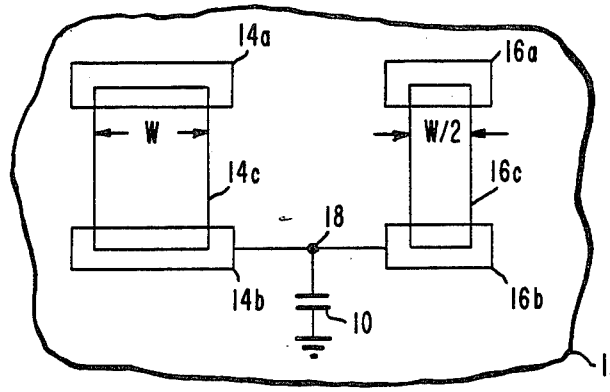

A prior art solution to this problem is to connect a compensating FET 16 to node 18 between the capacitor 10 and the switching FET 14. The switching and compensating FETs 14, 16 are operated in complementary fashion by an inverter 19 connected between their gates so that when the switching FET 14 is turned off, the compensating FET 16 is turned on. Referring to FIG. 1b, the switching FET 14 is formed on a substrate 1 and comprises a source 14a, a drain 14b and an overlying insulated gate 14c. The compensating FET 16 comprises a source 16a, a drain 16b and an overlying gate 16c having a width W/2 which is one-half the width W of the gate 14c of the switching FET. Accordingly, the channel charge storing capacity of the compensating FET 16 is approximately one-half that of the switching FET 14. Thus, when the switching FET 14 is turned off, the charge $(\frac{1}{2})Q$ expelled to the node 18 is stored in the channel of the compensating FET 16 rather than on the capacitor 10. The switching FET 16 attracts the expelled charge $(\frac{1}{2})Q$ into its source-to-drain channel as it is turned on.

Significantly, the channel charge storing capacity of a MOSFET is proportional to the width of its gate electrode and to the oxide capacitance (or thickness) between its gate electrode and the substrate.

The prior art switch of FIGS. 1a and b suffers from the disadvantage that spatial variations in oxide thickness and gate width across the surface of the semiconductive substrate 1 create errors in the compensation performed by the compensating FET 16. Such variations arise from well-known deficiencies in MOS fabrication techniques. Specifically, the gate width of the compensating FET 16 may not be precisely W/2, so that the charge $(\frac{1}{2})Q$ expelled from the switching transistor 14 will not be precisely compensated, and the voltage stored across the capacitor 10 will change as the transistors 14, 16 are switched on and off. For example, the gate width of the switching FET 14 may be W while the gate width of the compensating FET 16 may be $(W+\Delta W)/2$. Furthermore, oxide capacitance varies with changes in oxide thickness. The oxide capacitance in the switching transistor 14 may be $C_0$ while the oxide capacitance of the compensating FET may be $C_0+\Delta C_0$. The error terms $\Delta W$ and $\Delta C_0$ are linear (or "first order") and arise from well-known MOS processing deficiencies which will not be described here.

Figure 2A:
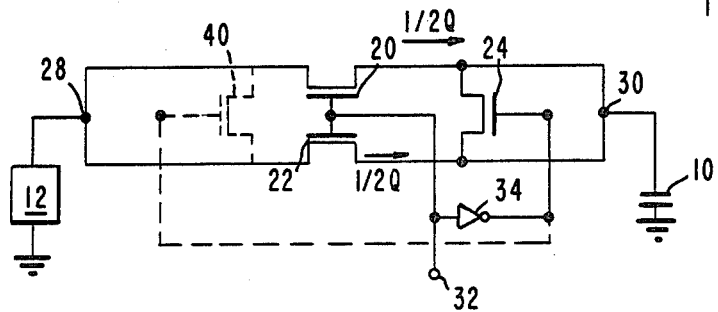
FIG. 2a is a simplified schematic diagram illustrating the concept of the channel charge compensated switch of the present invention.

Channel charge compensation is achieved independently of the first order processing variations $\Delta W$ and $\Delta C_0$ in the present invention illustrated in FIG. 2a. Two switching FETs 20, 22 are connected between the precision capacitor 10 and the circuit 12 and a symmetrically located compensating FET 24 is connected across them. As illustrated in the plan view of FIG. 2b, the compensating FET 24 is located exactly half-way between the switching FETs 20, 22 in a symmetrical configuration on the semiconductive substrate 1. The switching FETs 20, 22 are connected in parallel, their sources connected to an input node 28 and their drains connected to an output node 30. The compensating FET 24 is connected across the drains of the switching FETs 20, 22. It should be understood, of course, that the location of the sources and drains of the switching FETs 20, 22 may be opposite to that described herein. It is apparent in FIG. 2a that the source and drain of the compensating FET 24 are actually shorted together through the node 30. However, this is perfectly acceptable since the compensating FET 24 performs no switching function but acts instead as a repository for channel charge expelled from the switching FETs 20, 22.

Figure 2D:
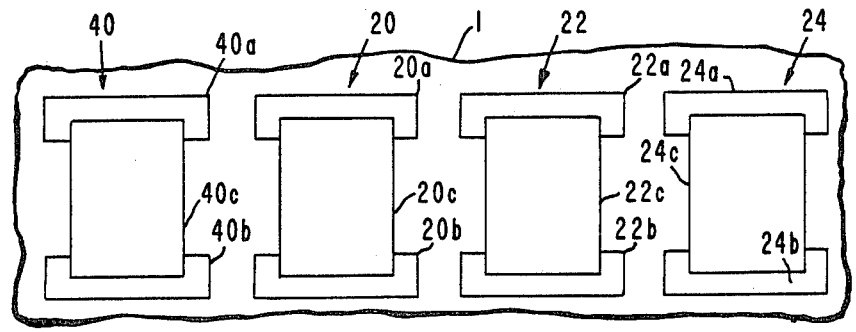
Figure 2B:
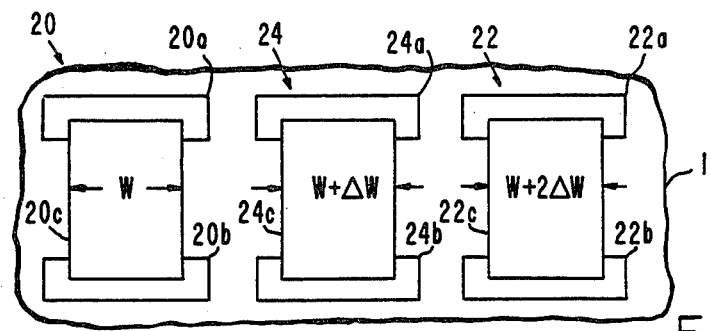
Figure 2C:
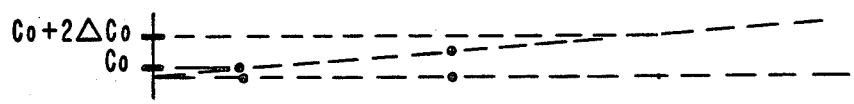

As illustrated in FIG. 2b, each of the FETs 20, 22, 24 comprises a source 20a, 22a, 24a, a drain 20b, 22b, 24b, and a gate 20c, 22c, 24c respectively. FIG. 2c illustrates an exemplary linear variation in oxide thickness beneath the gates 20a, 22a, 24a which can arise from the well-known MOS processing deficiencies. As noted in FIG. 2b, the corresponding oxide capacitance beneath the switching transitors 20, 22 is $C_0$ and $C_0+2\Delta C_0$, respectively, while the oxide capacitance beneath the gate 24c of the compensating FET is $C_0+\Delta C$. Accordingly, the total oxide capacitance of the two switching FETs 20, 22 is $2(C_0+\Delta C_0)$, which is exactly twice the oxide capacitance of the compensating FET 24, $C_0+\Delta C_0$. The oxide capacitance of the compensating FET 24 is therefore always one-half that of the combined switching FETs 20, 22, regardless of the magnitude of the first order processing variations in oxide capacitance $\Delta C_0$. As a result, the ratio of the channel charge storing capacities of the switching and compensation FETs is unaffected by $\Delta C_0$, a significant advantage.

An analogous situation exists with the gate width which may also vary in linear fashion across the surface of the substrate 1 due to well-known MOS processing deficiencies. Specifically, as noted in FIG. 2b, the width of the two switching transistor gates 20c, 22c is W and $W+2\Delta W$, respectively, while the corresponding width of the compensating FET gate 24c is $W+\Delta W$. Accordingly, the gate width $2(W+\Delta W)$ of the combination of the switching FETs 20, 22, is always twice that of the compensating FET 24, $W+\Delta W$, regardless of the variation in gate width $\Delta W$ caused by first order processing variations. As a result, the ratio of the channel charge storing capacities of the switching and compensation FETs is unaffected by either of the first order process variations $\Delta C_0$ and $\Delta W$.

Thus, as indicated in FIG. 2a, one-half of the channel charge, $(\frac{1}{2})Q$, stored in each of the switching FETs 20, 22 is ejected toward the output node 30 when they are turned off. The remaining half of the ejected charge, $(\frac{1}{2})Q$, from each of the switching transistors 20, 22 is ejected toward the input node 28. Accordingly, the compensating transistor 24 absorbs a total amount of charge Q, which is the sum of the charge ejected through the drains of the switching transistors 20, 22. The gates 20c, 22c are turned on whenever the gate 24c is turned off, and vice versa, in response to a switching signal applied to a switch terminal 32, because an inverter 34 is connected between the switch terminal 32 and the gate 24c. Accordingly, as the potential on the switch terminal 32 is raised and lowered, a charge of $(\frac{1}{2})Q$ is exchanged between each drain of the switching transistors 20, 22 and the source and drain of the compensating transistor 24, respectively. Accordingly, virtually no channel charge flows through the node 30. Thus, the voltage on the precision capacitor 10 does not change as the switch of FIG. 2a is operated, regardless of first order processing variations $\Delta C_o$, $\Delta W$, a significant advantage.

The remaining charge expelled from the sources of the switching FETs 20, 22 may be prevented from reaching the input node 28 by adding a fourth transistor 40 which serves as a second compensating FET. The source and drain of the compensating FET 40 are connected to the sources of the switching FETs 20, 22, respectively. FIG. 2d illustrates a symmetrical arrangement of the four transistors 20, 22, 24, 40 in which charge compensation of the expelled charge $(\frac{1}{2})Q$ flowing through each of the sources and drains of the switching transistors 20, 22 is performed with a precision which is unaffected by first order processing variations in gate width $\Delta W$ and oxide capacitance $\Delta C_0$. In the four transistor embodiment of FIG. 2d, the two switching transistors 20, 22 are placed next to one another while the two compensating transistors 24, 40 are placed at either end of the four transistor array. Each of the transistors 20, 22, 24, 40 is designed to have the same gate width. Accordingly, the four transistor embodiment of FIG. 2d compensates for channel charge expelled from both the sources and the drains of the switching transistors 20, 22 with a precision independent of first order processing variations.

For example, if a photolithographic masking error creates a linear (or first order) spatial variation in gate width across the substrate 1, the compensating transistor 40 may have a gate width W, the adjacent switching transistor 20 may have a gate width $W+\Delta W$, the next adjacent switching transistor 22 may have a gate width $W+2\Delta W$ while the adjacent compensating transistor 24 may have a gate width $W+3\Delta W$. However, the combined gate width of the compensating transistors 24, 40 is $2W+3\Delta W$, which is precisely equal to the combined gate width of the two switching transistors 20, 22. Accordingly, the channel charge storing capacity of the compensating transistor pair 24, 40 is equal to that of the switching transistor pair 20, 22. Thus, all of the channel charge ejected from the switching transistors 20, 22 is stored in the compensating transistors 24, 40 during a first switching cycle, the channel charge then being returned to the switching transistors 20, 22 during the next switching cycle. It should be noted that the compensating transistor pair may be exchanged with the switching transistor pair.

Figure 3:
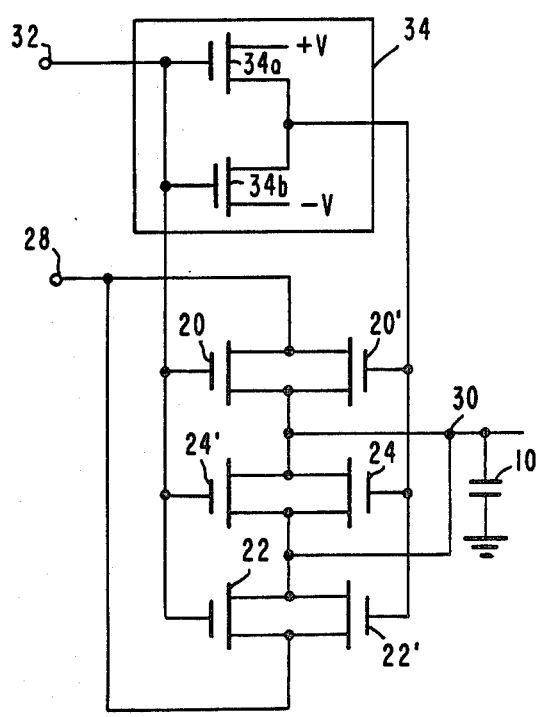

FIG. 3 is a simplified schematic diagram of a complementary version of the three transistor embodiment of FIG. 2b, wherein each of the transistors 20, 22, 24 is an n-channel MOSFET, the embodiment of FIG. 3 further including complementary p-channel MOSFETs 20', 22', 24' connected in parallel with each of the n-channel MOSFETs 20, 22, 24, respectively. The inverter 34 comprises a p- and n-channel transistor pair 34a, 34b connected in series in the well-known manner.

Figure 4A:
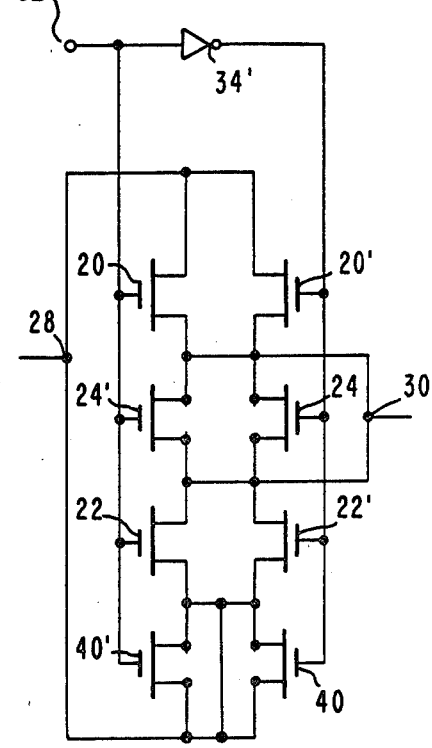

FIG. 4a is a schematic diagram of a complementary version of the four transistor embodiment of FIG. 2d wherein each of the transistors 20, 22, 24, and 40 is an n-channel MOSFET which is connected in parallel with a corresponding p-channel MOSFET 20', 22', 24', and 40', respectively.

In both FIGS. 3 and 4a, the gates of the n-channel switching MOSFETs and the p-channel compensating MOSFETs are connected together to the switching terminal 32 and to one side of the inverter 34. The gates of the p-channel switching MOSFETs and the n-channel compensating MOSFETs are connected together to the opposite side of the inverter 34.

Figure 4B:
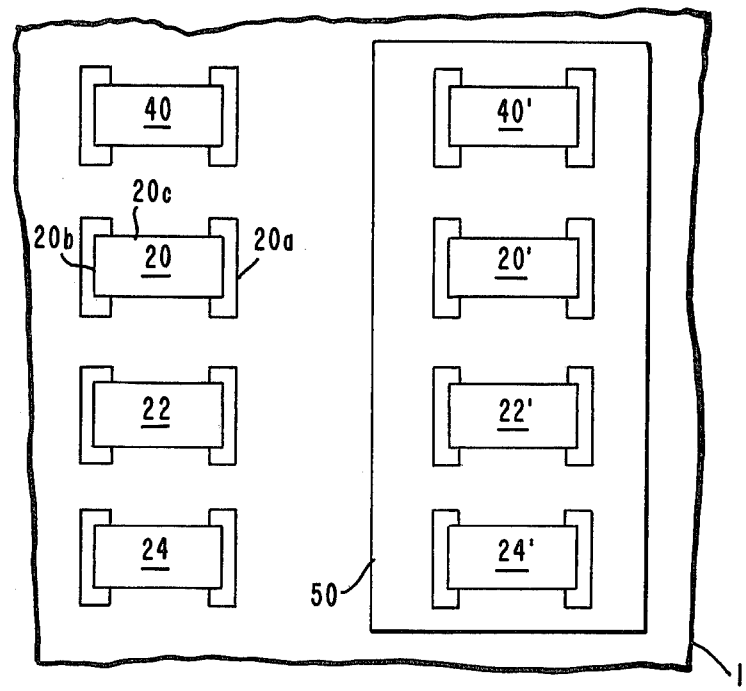

FIG. 4b is a simplified top plan view illustrating one possible arrangement of the eight transistors of FIG. 4a on a p-type semiconductor layer 1. Each of the n-channel MOSFETs is located in a first column while the p-channel MOSFETs are located in a n-type well 50 in a second column.

Operation of the embodiment of FIG. 4a will now be described. The inverter 34' generates a voltage at its output terminal of opposite polarity to the potential of its input terminal. If a positive voltage is applied to the switch terminal 32, the gates of the transistors 20, 24', 22 and 40' receive a positive voltage while the gates of the transistors 20', 24, 22' and 40 receive a negative voltage through the inverter 34'. Accordingly, the transistor pairs 20, 20', 22, 22' are turned on. Later, a negative voltage may be applied to the switch terminal 32, thus turning off the transistors 20, 20', 22, 22' while simultaneously turning on the transistors 24, 24' and 40, 40'. Charge stored in the source-to-drain channels of each of the transistors 20, 20' and 22, 22' is immediately ejected therefrom. One-half of the channel charge from the switching transistor 22 is transferred into the channel of the compensating transistor 40 while the other half of the channel charge stored in the switching transistor 22 is expelled into the channel of the compensating transistor 24. One-half of the channel charge stored in the switching transistor 20 is expelled into the channel of the compensating transistor 24 while the remaining half of the channel charge from the switching transistor 20 is expelled into the compensating transistor 40. Charge compensation occurs in a similar manner among the p-channel transistors 20', 22', 24' and 40'. When the voltage on the switch terminal 32 is again changed to a positive voltage, the channel charge is returned from the compensating transistors 24, 40 to the switching transistors 20, 22 in an equal amount. Accordingly, as the potential on the switching terminal 32 is changed, channel charge is exchanged between the compensating and switching transistors in a precise manner which is independent of first order process variations. Accordingly, virtually no channel charge reaches the input or output nodes 28, 30, a significant advantage.

Figure 5:
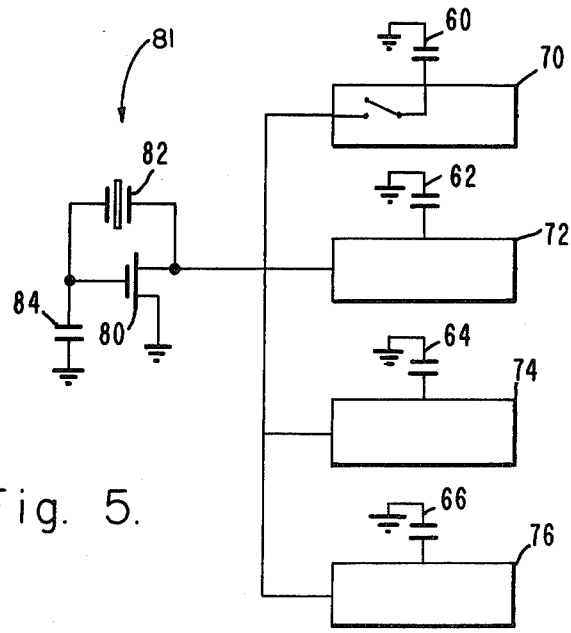
FIG. 5 is a simplified schematic diagram illustrating one possible use of the channel charge compensated switch of the invention in the tuning section of a watch circuit.

FIG. 5 illustrates one use of the invention in the tuning section of a watch circuit. A plurality of tuning capacitors 60, 62, 64, 66 are connected through a corresponding plurality of channel charge compensated switches of the present invention 70, 72, 74, 76 to a Pierce oscillator comprising a MOS inverter 80 connected across a quartz crystal 82 and an oscillating capacitor 84. Accordingly, the oscillator 81 may be precisely tuned through selection of certain ones of the tuning capacitors 60–66 by selectively operating the switches 70–76. The advantage of the use of the invention in the manner illustrated in FIG. 5 is that the tuning action of the capacitors 60–66 is not affected by accidental charging of the capacitors whenever one of the switches 70–76 is switched. Each of the switches 70–76 prevents channel charge from charging or discharging any of the capacitors 60–66, thus improving the accuracy with which the oscillator 81 may be tuned.

What is claimed is:

1. A precision semiconductor switch comprising:
   an input node and an output node;
   a pair of switching transistors, each comprising a source and a drain, the source/drain current paths of the switching transistors being connected between the input and output nodes so that said switching transistors are connected in parallel with one another;
   a compensating transistor comprising a compensating source and drain, said compensating transistor having its source and drain both connected together and to said output node; and
   means for applying a control signal to the gates of said switching transistor pair and means for applying the logical complement of said control signal to the gate of said compensating transistor.

2. The switch of claim 1 further comprising a second compensating transistor comprising a second compensating source and drain, its source and drain both being connected together and to said input node.

3. The switch of claim 1 wherein said compensating transistor has a channel charge storage capacity equal to approximately one-half the channel charge storage capacity of the combination of said pair of switching transistors.

4. The switch of claim 2 wherein said compensating transistor pair have a combined channel charge capacity equal to approximately the combined channel charge storage capacity of said switching transistor pair.

5. The switch of claim 1 wherein each of said transistors comprises a gate, each gate of said switching transistor pair being connected together, said switch further comprising a switching node and an inverter, said switching node being connected to each switching transistor gate and being connected through said inverter to the gate of said compensating transistor.

6. The switch of claim 1 wherein each of said transistors comprises an n-channel field effect transistor, said switch further comprising a plurality of p-channel transistors having their sources and drains connected to the sources and drains, respectively, of the corresponding n-channel transistors.

7. The switch of claim 1 wherein said transistors are formed on a common semiconductive substrate and are arranged thereon in a symmetrical fashion.

8. The switch of claim 1 wherein said transistors are formed on a common semiconductive substrate, said switching transistors being formed with space therebetween, and said compensating transistor being located in said space whereby the distance from said compensating transistor to each of said switching transistors is approximately equal.

9. The switch of claim 2 wherein said transistors are formed on a semiconductive substrate, said switching transistors being a first transistor pair and said compensating transistors being a second transistor pair, one of said pair being adjacent one another and separating the transistors of the other pair.

10. The switch of claim 6 including a plurality of gates individually associated with each of said transistors wherein the gates of the n-channel switching transistors and of the p-channel compensating transistor are connected together and to receive a switching signal, and wherein the gates of the p-channel switching transistors and of the n-channel compensating transistor are connected together and to receive an inverted switching signal.

11. The switch of claim 2 wherein each of said transistors comprises an n-channel transistor, said switch further comprising a plurality of p-channel transistors having their sources and drains connected to the sources and drains, respectively, of corresponding ones of said n-channel transistors, said switch further including a plurality of gates associated with each of said transistors, and wherein the gates of the n-channel switching transistors and with the p-channel compensating transistors are connected together to receive a switching signal, and wherein the gates of the p-channel switching transistors and of the n-channel compensating transistors are connected together and to receive an inverted switching signal.

12. A precision semiconductor switch comprising:
   an input node and an output node;
   a pair of field effect transistors connected in parallel, the source/drain current paths of the switching transistors being connected between said input and output nodes as a switch across said nodes;
   a compensating field effect transistor having its source and drain both connected together and to either said input or output node; and
   means for applying a control signal to the gates of said switching transistor pair and means for applying the logical compliment of said control signal to the gate of said compensating transistor.

* * * * *